(12) United States Patent
Huang et al.

(10) Patent No.: US 6,287,939 B1
(45) Date of Patent: Sep. 11, 2001

(54) METHOD FOR FABRICATING A SHALLOW TRENCH ISOLATION WHICH IS NOT SUSCEPTIBLE TO BURIED CONTACT TRENCH FORMATION

(75) Inventors: Kuo Ching Huang, Kaohsiung; Tse-Liang Ying; Wen-Chuan Chiang, both of Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/216,789

(22) Filed: Dec. 21, 1998

(51) Int. Cl.$^7$ .................................................. H01L 21/76
(52) U.S. Cl. ........................ 438/435; 438/423; 438/524; 438/530
(58) Field of Search .................................. 438/407, 424, 438/427, 433, 434, 514, 524, 526, 530

(56) References Cited

U.S. PATENT DOCUMENTS

| | | | |
|---|---|---|---|
| 4,968,636 | * 11/1990 | Sugawara | 438/423 |
| 5,316,965 | 5/1994 | Philipossian et al. | 437/70 |
| 5,468,657 | 11/1995 | Hsa | 437/24 |
| 5,516,707 | 5/1996 | Loh et al. | 437/24 |
| 5,741,740 | 4/1998 | Jang et al. | 438/435 |
| 5,763,315 | 6/1998 | Benedict et al. | 438/424 |
| 5,902,127 | * 5/1999 | Park | 438/435 |
| 5,923,993 | * 7/1999 | Sahota | 438/424 |
| 6,211,021 | * 4/2001 | Wang et al. | 438/424 |

OTHER PUBLICATIONS

Soleimani et al. "Formation of Ultrathin Nitrided SiO$_2$ Oxides by Direct Nitrogen Implantation into Silicon", Journal of Electrochemical Society, vol. 142, No. 8, Aug. 1995, p132–134.
"High Performance 0.2 μm CMOS with 25 ↑ Gate oxide Grown on Nitrogen Implanted SiSubstrates" IEDM 96-499-502.

* cited by examiner

Primary Examiner—Olik Chaudhuri
Assistant Examiner—Anh Duy Mai
(74) Attorney, Agent, or Firm—George O. Saile; Stephen B. Ackerman; William J. Stoffel

(57) ABSTRACT

The invention provides a method for fabricating a shallow trench isolation which is not susceptable to buried contact trench formation. The invention also provides immunity from the STI "kink effect," as well as benefits associated with nitridation. The process begins by forming a pad oxide layer on a semiconductor substrate. A nitride layer is formed on the pad oxide layer. The nitride layer, the pad oxide layer, and the semiconductor substrate are patterned to form trenches. Next, a fill oxide layer is formed over the nitride layer, the pad oxide layer, and the semiconductor substrate. The fill oxide layer is chemical-mechanical polished, stopping on the nitride layer to form fill oxide regions. N$_2$ ions are implanted into the fill oxide regions. An anneal is performed to form a buried oxynitride layer. The buried oxynitride layer is partially above the level of the top surface of the semiconductor substrate and partially below the level of the top surface of the semiconductor substrate. The nitride layer is removed. Then, the pad oxide layer and portions of the fill oxide regions are removed using the buried oxynitride layer as an etch stop, forming shallow trench isolations.

12 Claims, 2 Drawing Sheets

METHOD FOR FABRICATING A SHALLOW TRENCH ISOLATION WHICH IS NOT SUSCEPTIBLE TO BURIED CONTACT TRENCH FORMATION

BACKGROUND OF INVENTION

1. Field of the Invention

This invention relates generally to fabrication of semiconductor devices and more particularly to the fabrication of semiconductor devices and more particularly to fabrication of a shallow trench isolation which is not susceptable to buried contact trench formation.

2. Description of the Prior Art

As device dimensions and die sizes continue to decrease to aceive higher density integrated circuits, there is a growing demand for more effective isolation technology. Shallow trench isolation (STI) technology has become more widely used due to the lack of encroachment like the "bird beak" in LOCOS technology and due to the lower susceptability to "Latch-up." However, several problems exist with conventional shallow trench isolation technology. If misalignment occurs during the contact etching process, a trench can form in the buried contact. This trench, known as a buried contact trench creates a leakage path between the contact and the substrate.

Another problem associated with shallow trench isolation technology is called the "kink effect" caused by oxide thinning. During conventional STI etch, a recess is formed near the edge of the STI. This geometry causes the gate oxide to be thinner over the edge formed where the recess begins, resulting in a reduced threshhold voltage and additional standby current.

Recent research has shown several advantages to nitrogen implantation into silicon dioxide isolations. For example, Formation of Ultrathin Nitrided SiO2 Oxides by direct Nitrogen Implantation into Silicon, Journal of Electrochemical Society, Vol. 142 No. 8, August 1995, discloses a process for silicon dioxide nitridation to improve resistance to the hot carrier effect while minimizing ion implantation damage. Another article, High Performance 0.2 μm CMOS with 25 Å Gate Oxide Grown on Nitrogen Implanted Si Substrates, IEDM 96-499, discloses that implanted nitrogen can prevent Boron penetration and supress short-channel effect and drain induced barrier lowering (DIBL) effect.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,316,965 (Philipossian et al.) shows a nitrogen ion implantation to acheive a comparable etch rate to a thermal oxide pad layer.

U.S. Pat. No. 5,468,657 (Hsu) discloses a SIMOX process with $N_2$ ion implant into the oxide.

U.S. Pat. No. 5,516,707 (Loh et al.) shows an angled nitrogen implantation into source/drain regions to improve hot carrier immunity.

U.S. Pat. No. 5,741,740 (Jang et al.) shows a method of filling a trench which may include nitrogen treatment of a liner oxide prior to filling the trench.

U.S. Pat. No. 5,763,315 (Benedict et al.) shows an oxynitride liner formation prior to filling a trench.

SUMMARY OF THE INVENTION

It is an object of the present invention to provide a method for fabricating a shallow trench isolation which is not susceptable to buried contact trench formation.

It is another object of the present invention to provide a method for fabricating a shallow trench isolation with immunity from the "Kink effect."

It is another object of the present invention to provide a method for fabricating a shallow trench isolation wherein nitridation prevents boron penetration.

It is yet another object of the present invention to provide a method for fabricating a shallow trench isolation wherein nitridation reduces short channel effect and DIBL effect.

To accomplish the above objectives, the present invention provides a method for fabricating a shallow trench isolation which is not susceptable to buried contact trench formation. The process begins by forming a pad oxide layer (12) on a semiconductor substrate (10). A nitride layer (14) is formed on the pad oxide layer (12). The nitride layer (14), the pad oxide layer (12), and the semiconductor substrate (10) are patterned to form trenches (16). Next, a fill oxide layer (18) is formed over the nitride layer (14), the pad oxide layer (12), and the semiconductor substrate (10). The fill oxide layer (18) is chemical-mechanical polished, stopping on the nitride layer (14) to form fill oxide regions (18A). $N_2$ ions are implanted into the fill oxide regions (18A). An anneal is performed to form a buried oxynitride layer (20). The buried oxynitride layer is partially above the level of the top surface of the semiconductor substrate (10) and partially below the level of the top surface of the semiconductor substrate (10). The nitride layer (14) is removed. Then, the pad oxide layer (12) and portions of the fill oxide regions (18A) are removed using the buried oxynitride layer (20) as an etch stop, forming shallow trench isolations (22).

The present invention provides considerable improvement over the prior art. In the present invention a buried oxynitride layer is formed beneath the surface of the fill oxide formed in isolation trenches. This oxynitride layer can be used as an etch stop during etching of the overlying fill oxide and the pad oxide preventing recesses and the kink effect. When the buried oxynitride layer is formed at a depth where a portion is below the level of the adjacent substrate, that portion is left to prevent trenching during contact overetch. The nitridation also provides additional benefits known in the art.

The present invention achieves these benefits in the context of known process technology. However, a further understanding of the nature and advantages of the present invention may be realized by reference to the latter portions of the specification and attached drawings. Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method of fabricating a shallow trench isolation which is not susceptable to buried contact trench formation.

Figure 1:
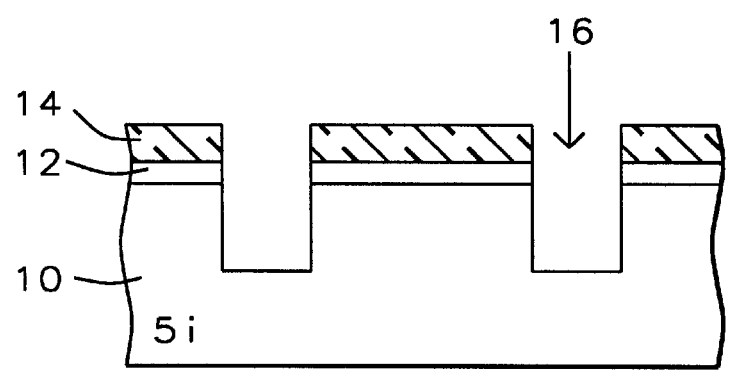
FIGS. 1, 2, 3, 4 & 5 illustrate sequential sectional views of a process for fabrication of a shallow trench isolation which is not susceptable to buried contact trench formation according to the invention.

Referring to FIG. 1, the process begins by forming a pad oxide layer (12) on a semiconductor substrate (10). The pad oxide layer (12) can be formed using a chemical vapor deposition precess or it can be grown at a temperature between 700° C. and 1200° C. in a wet oxygen (steam) ambient. It preferably has a thickness between about 50 Å and 300 Å.

Still referring to FIG. 1, a nitride layer (14) is formed on the pad oxide layer (12). The silicon nitride layer (14) can be formed by reacting dichlorosilane and ammonia or by plasma enhanced chemical vapor deposition. It preferably has a thickness between about 1000 Å and 3000 Å.

Still referring to FIG. 1, the nitride layer (14), the pad oxide layer (12) and the semiconductor substrate (10) are patterned to form trenches (16). The trenches (16) preferably have a total depth of between about 2000 Å and 10,000 Å.

Figure 2:
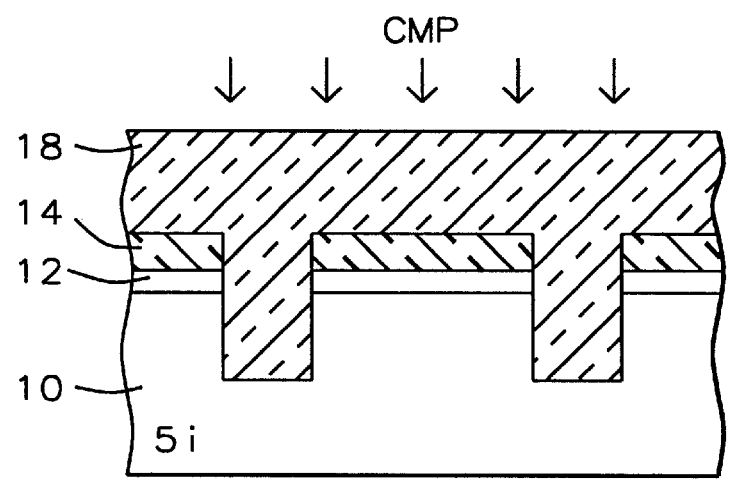

Referring to FIG. 2, a fill oxide layer (18) is formed over the nitride layer (14), the pad oxide layer (12), and the semiconductor substrate (10). The fill oxide layer is preferably formed using a sub-atmospheric, high density plasma deposition (SA-HDP). The fill oxide layer (18) preferably has a sufficient thickness to completely cover the nitride layer (14). The fill oxide layer (18) is planarized using chemical-mechanical polishing (CMP) leaving fill oxide regions (18A) in the trenches (16). The nitride layer (14) is preferably used as a CMP stop.

Figure 3:
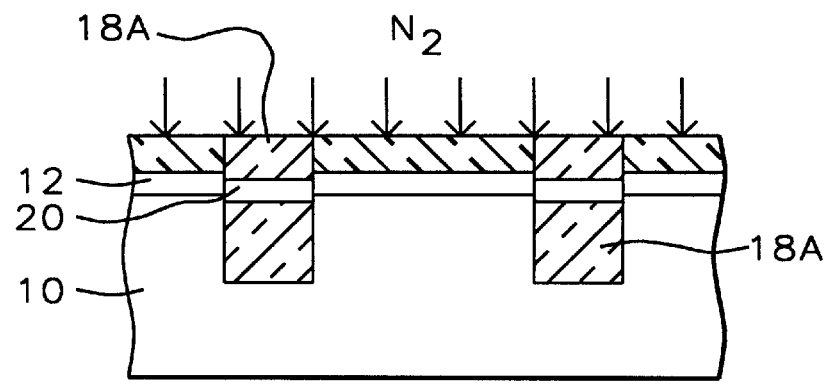

In a key step, as shown in FIG. 3, $N_2$ ions are implanted below the surface of the fill oxide region (18A) and annealed to form a buried oxynitride layer (20). By controlling the implant energy and the anneal temperature, a thin buried oxynitride layer (20) can be formed below the surface of the fill oxide region (18A). The buried oxynitride layer divides the fill oxide region into an upper portion, above the buried oxynitride layer and a lower portion, below the buried oxynitride layer. The $N_2$ ions are preferably implanted at an energy of between about 50 KeV and 100 KeV and at a dose of between about 1 E 12 atm/cm$^2$ and 1 E 16 atm/cm$^2$. The anneal is preferably performed at a temperature of between about 800° C. and 1100° C. using either RTA or a furnace anneal.

It is critical to the present invention for the buried oxynitride layer (20) to have a thickness of between about 100 angstroms and 200 angstroms and to be buried at a depth of between 1000 angstroms and 3000 angstroms where it is partially above and partially below the top surface of the substrate (10) adjacent to the trenches (16). Because the buried oxynitride layer (20) has a slower etch rate than the portion of the fill oxide region (18A) overlying it, it acts as an etch stop during planarizing etch of the fill oxide region (18A), preventing dishing of the fill oxide. Because the buried oxynitride layer is partially below the surface of the adjacent substrate (10), a portion of the buried oxynitride layer remains after STI formation. The remaining portion of the buried oxynitride layer prevents buried contact trench formation and "kink effect" due to over-etching during contact formation. It can also prevent boron penetration for p-MOSFETs and suppress short channel effects.

Figure 4:
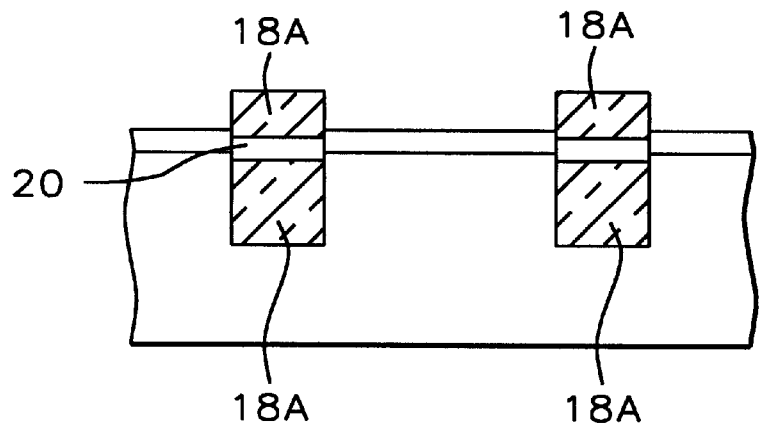

Referring to FIG. 4, the nitride layer (14) is removed leaving fill oxide regions (18A) which rise above the adjacent pad oxide layer (12). The nitride layer can be removed using a any of a number of conventional techniques, including a hot phosphoric acid wash or a plasma etch.

Figure 5:
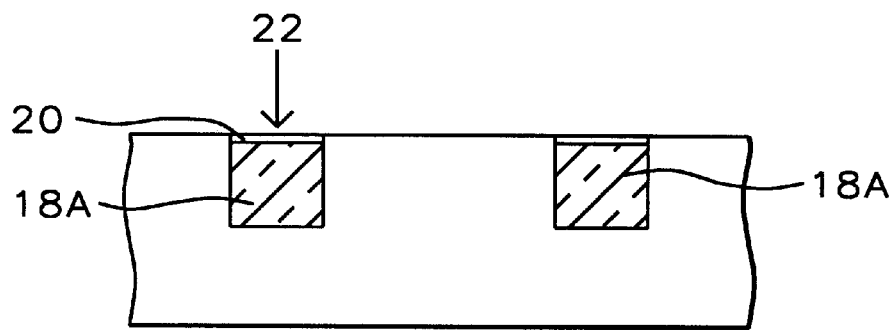

Referring to FIG. 5, the pad oxide layer (12) is removed. The pad oxide layer (12) can be removed using a plasma etch with $CF_4$ and $O_2$ as source gasses, a buffered HF etch, or any other etch that can remove the pad oxide layer (12) and stop on the buried oxynitride layer (20). The upper portion of the fill oxide region (18A) is removed during the pad oxide etch, forming shallow trench isolations (STIs) (22). The STIs (22) comprise the lower portion of the fill oxide region (18A) and a portion of the buried oxynitride layer (20) overlying the lower portion of the fill oxide region. The buried oxynitride layer (20) acts as an etch stop during the pad oxide etch. The pad oxide and fill oxide to buried oxynitride layer etch rate ratio is preferably between about 3:1 and 8:1. The STIs are approximately co-planer with the top surface of the adjacent substrate (10) surface, preventing the oxide thinning adjacent to the STIs which is responsible for the "kinking effect" typical of prior STI processes.

Figure 6:
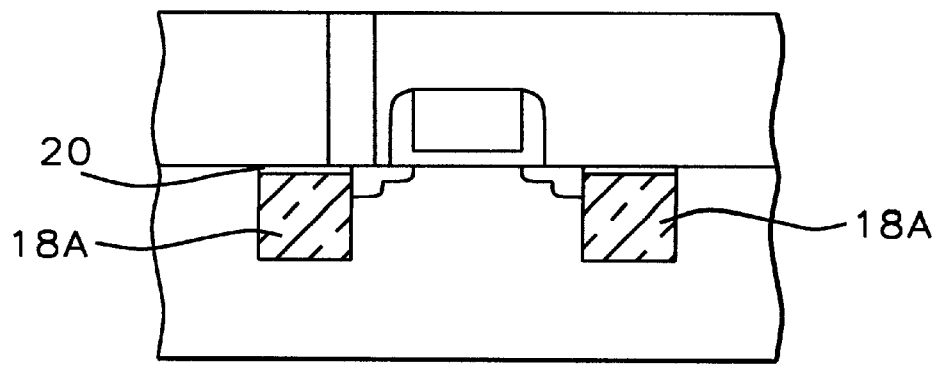
FIG. 6 illustrates a device formed between STIs fabricated according to the invention. The contact is shown overlapping the STI without causing a buried contact trench.

FIG. 6 illustrates a device manufactured using the process according to the invention. As shown, the presence of the oxynitride layer (20) prevents buried contact trench formation and oxide thinning. The oxynitride layer (20) can also prevent Boron penetration and short channel effects.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a shallow trench isolation which is not susceptible to the buried contact trench problem, comprising the steps of:

a) providing a semicoductor substrate having active areas wherein a pad oxide layer overlies said semiconductor substrate and a nitride layer overlies said pad oxide layer;

b) forming trenches in said nitride layer, said pad oxide layer, and said semiconductor substrate;

c) depositing a fill oxide in said trenches and planarizing said fill oxide to form fill oxide regions co-planar with said nitride layer;

d) forming a buried oxynitride layer in said fill oxide regions; said buried oxynitride layer having a thickness of between about 100 angstroms and 200 angstroms and being partially above the level of the top surface of said semiconductor substrate and partially below the level of the top surface of said semiconductor substrate; said buried oxynitrde layer dividing said fill oxide region into an upper portion overlying said buried oxynitride layer and a lower portion underlying said buried oxynitride layer;

e) removing said nitride layer; and f) etching said pad oxide layer and said upper portions of said fill oxide regions stopping on said buried oxynitride layer leaving a portion of said buried oxynitride layer and said lower portion of said fill oxide region;

thereby forming shallow trench isolations which are not susceptible to the buried contact trench problem.

2. The method of claim 1 wherein said buried oxynitride layer is formed by implanting $N_2$ ions at an energy between about 20 KeV and 500 KeV at a concentration of between about 1 E12 atm/cm$^2$ and 1 E 16 atm/cm$^2$, then annealed at a temperature of between about 800° C. and 1200° C. using either RTA or furnace annealing.

3. The method of claim 1 wherein said pad oxide layer has a thickness between about 50 Å and 300 Å and said nitride layer has a thickness between between about 1000 Å and 3000 Å.

4. The method of claim 1 wherein said fill oxide regions are formed using a sub-atmospheric—high density plasma deposition.

5. The method of claim 1 wherein said fill oxide regions extend a depth of between 950 Å and 7000 Å below the adjacent semiconductor substrate.

6. The method of claim 1 wherein thickness of said fill oxide regions above said buried oxynitride layer is between 1000 Å and 3000 Å.

7. A method for fabricating a shallow trench isolation which is not susceptable to the buried contact trench problem, comprising the steps of:

a) forming a pad oxide layer on a semiconductor substrate;

b) forming a nitride layer on said pad oxide layer;

c) patterning said nitride layer, said pad oxide layer, and said semiconductor substrate to form trenches;

d) forming a fill oxide layer over said nitride layer, said pad oxide layer, and said semiconductor substrate;

e) chemical-mechanical polishing said fill oxide layer stopping on said nitride layer to form fill oxide regions;

f) implanting $N_2$ ions into said fill oxide regions and performing an anneal to form a buried oxynitride layer having a thickness of between about 100 angstroms and 200 angstroms; said buried oxynitride layer being partially above the level of the top surface of said semiconductor substrate and partially below the level of the top surface of said semiconductor substrate; said buried oxynitrde layer dividing said fill oxide region into an upper portion overlying said buried oxynitride layer and a lower portion underlying said buried oxynitride layer;

g) removing said nitride layer;

h) etching said pad oxide layer and said upper portions of said fill oxide regions stopping on said buried oxynitride layer leaving said buried oxynitride layer and said lower portion of said fill oxide region; thereby forming shallow trench isolations which are not susceptible to the buried contact trench problem.

8. The method of claim 7 wherein said buried oxynitride layer is formed by implanting $N_2$ ions at an energy between about 20 KeV and 500 KeV at a concentration of between about 1 E12 atm/cm$^2$ and 1 E 16 atm/cm$^2$, then annealed at a temperature of between about 800° C. and 1200° C. using either RTA or furnace annealing.

9. The method of claim 7 wherein said pad oxide layer has a thickness between about 50 Å and 300 Å and said nitride layer has a thickness between between about 1000 Å and 3000 Å.

10. The method of claim 7 wherein said fill oxide layer is formed using a sub-atmospheric—high density plasma deposition.

11. The method of claim 7 wherein said fill oxide regions extend to a depth of between about 950 Å and 7000 Å below the adjacent semiconductor substrate.

12. The method of claim 1 wherein thickness of said fill oxide regions above said buried oxynitride layer is between 1000 Å and 3000 Å.

\* \* \* \* \*